United States Patent [19]
Szcyrbowski et al.

[11] Patent Number: 5,415,757
[45] Date of Patent: May 16, 1995

[54] APPARATUS FOR COATING A SUBSTRATE WITH ELECTRICALLY NONCONDUCTIVE COATINGS

[75] Inventors: Joachim Szcyrbowski, Goldbach; Goetz Teschner, Gelnhausen; Guenter Braeuer, Freigericht, all of Germany

[73] Assignee: Leybold Aktiengesellschaft, Hanau, Germany

[21] Appl. No.: 161,053

[22] Filed: Dec. 1, 1993

Related U.S. Application Data

[63] Continuation of Ser. No. 900,580, Jun. 18, 1992, abandoned, and a continuation of Ser. No. 900,575, Jun. 18, 1992, abandoned.

[30] Foreign Application Priority Data

| Nov. 26, 1991 | [DE] | Germany | 41 38 793.7 |
| Nov. 26, 1991 | [DE] | Germany | 41 38 794.5 |
| Feb. 19, 1992 | [DE] | Germany | 42 04 999.7 |
| Feb. 19, 1992 | [DE] | Germany | 42 04 998.9 |

[51] Int. Cl.$^6$ ............................................ C23C 14/34
[52] U.S. Cl. .................. 204/298.08; 204/192.12; 204/298.19
[58] Field of Search ............ 204/192.12, 298.06, 204/298.14, 298.16, 298.19, 298.08

[56] References Cited

U.S. PATENT DOCUMENTS

| 2,853,655 | 9/1958 | Harders et al. | 315/241 |
| 3,860,507 | 1/1975 | Vossen, Jr. | 204/192.2 |
| 4,792,730 | 12/1988 | Mintchev et al. | 319/209 SC |
| 4,887,005 | 12/1989 | Rough et al. | 315/111.21 |
| 4,956,070 | 9/1990 | Nakada et al. | 204/298.18 |
| 5,082,546 | 1/1992 | Szczyrbowski et al. | 204/298.08 |
| 5,126,032 | 6/1992 | Szczyrbowski et al. | 204/298.08 |
| 5,169,509 | 12/1992 | Latz et al. | 204/298.03 |
| 5,240,584 | 8/1993 | Szczyrbowski et al. | 204/298.08 |

FOREIGN PATENT DOCUMENTS

| 0186865 | 7/1986 | European Pat. Off. |
| 1556849 | 3/1967 | France |
| 1025234 | 2/1958 | Germany |
| 1068972 | 11/1959 | Germany |
| 2243708 | 4/1973 | Germany |
| 221202 | 4/1985 | Germany |
| 3541621 | 5/1987 | Germany |
| 252205 | 12/1987 | Germany |
| 3802852 | 8/1989 | Germany |
| 3912572 | 11/1989 | Germany |
| 4042289 | 12/1990 | Germany |
| 4106770 | 3/1991 | Germany |
| 4136655 | 11/1991 | Germany |
| 2156081 | 6/1990 | Japan |

*Primary Examiner*—Nam Nguyen
*Attorney, Agent, or Firm*—Felfe & Lynch

[57] ABSTRACT

Method and an apparatus for coating a substrate from electrically conductive targets (3, 4) in a reactive atmosphere, comprising a power source (12, 13, 14) which is connected to cathodes (1, 2) disposed in an evacuable coating chamber (15) and cooperating electrically with the targets (3, 4), two anodes (5, 6) electrically separated from one another and from the sputtering chamber (15) being provided, which lie in a plane between the cathodes (1, 2) and the substrate (7), the two output terminals (12a, 12b) of the secondary winding of a transformer (12) connected, with interposition of a choke coil (14), to a medium frequency generator (13) being connected each to a cathode (1 and 2, respectively) via two supply lines (20, 21) and the two supply lines (20, 21) being connected via a branch line (22) into which a resonant circuit is inserted, and each of the two supply lines (20, 21) being coupled both via a first network (16 and 17, respectively) to the coating chamber and via a corresponding second network (8 and 9, respectively) to the particular anode (5 and 6, respectively).

23 Claims, 4 Drawing Sheets

APPARATUS FOR COATING A SUBSTRATE WITH ELECTRICALLY NONCONDUCTIVE COATINGS

This application is a continuation of application Ser. No. 900,580, filed Jun. 18, 1992 abandoned, and a continuation of application Ser. No. 900,575, filed Jun. 18, 1992, abandoned.

BACKGROUND OF THE INVENTION

The invention relates to a method and an apparatus for coating a substrate, especially with electrically nonconductive coatings from electrically conductive targets in a reactive (e.g., oxidizing) atmosphere, comprising a power source which is connected to cathodes containing magnets and disposed in an evacuable coating chamber, which cathodes cooperate electrically with the targets, which deposit themselves on the substrate. Anodes are disposed separated electrically from one another and from the sputtering chamber and are provided in a plane between the cathodes and the substrate.

A sputtering apparatus for the production of thin coatings is known (DD 252,205), comprising a magnet system and, disposed above it, at least two electrodes of the material to be sputtered, these electrodes being electrically configured such that they are alternately the cathode and anode of a gas discharge. For this purpose the electrodes are connected to a sinusoidal alternating voltage of preferably 50 Hz.

This known sputtering apparatus is to be especially suitable for the deposit of dielectric coatings by reactive sputtering. By operating the apparatus at about 50 Hz it is desired to prevent the occurrence of glitter on the anode and, in the case of metal coating, to prevent electrical shorting (so-called "arcing").

In another already known apparatus for sputtering a thin film, in which the rate of speed with which coatings of different materials can be deposited is controllable (DE 39 12 572, to which U.S. Pat. No. 4,956,070 corresponds) in order thus to arrive at extremely thin layer packs, at least two different kinds of counterelectrodes are disposed on the cathode side.

Also known is a system for depositing a metal alloy by means of radiofrequency cathode sputtering (DE 35 41 621) in which two targets are alternately activated, and the targets contain the metal components of the metal alloy to be deposited, but in different proportions. The substrates are for this purpose disposed on a substrate holder which is set in rotation by a drive unit during the sputtering process.

It is furthermore known, through a prior published printed disclosure (DE 38 02 852), in the case of an apparatus for coating a substrate with two electrodes and at least one material for sputtering, to dispose the substrate between the two electrodes at a distance apart and select the half-waves of the alternating current to serve as low-frequency half-waves of substantially equal amplitudes.

According to another prior published printed disclosure (DE 22 43 708), a method for the production of a glow discharge is known, which has an electrode arrangement placed in a working gas, to which a working voltage is applied, the method being characterized by the production of a magnetic field which together with the electrode arrangement results in at least one trap for holding virtually all electrons emitted by the electrode arrangement which have sufficient energy to ionize the working gas. For this process an electrode arrangement is used in which the electrodes are provided in pairs. In particular, this disclosure also describes hollow electrodes in whose interior a glow discharge can be produced, the electrodes being in the form of tube shells.

A method and an apparatus is furthermore described in an older, not previously published patent application (German P 41 06 770.3 to which U.S. Pat. No. 5,169,509 corresponds) for the reactive coating of a substrate with an electrically insulating material, for example with silicon dioxide ($SiO_2$), comprising an alternating current source which is connected to cathodes enclosing magnets disposed in a coating chamber, which cooperate with targets, two ungrounded output terminals of the alternating current source being connected each to a cathode bearing a target, the two cathodes being placed side by side in a plasma space in the coating chamber and being each at about the same distance away from the oppositely lying substrate. The effective level of the discharge voltage is measured by an effective-voltage detector connected by a conductor to the cathode and delivered as D.C. voltage by a conductor to a controller which by means of a regulating valve controls the flow of reactive gas from the tank into the distribution line such that the measured voltage agrees with a set voltage.

Lastly, an apparatus for the reactive coating of a substrate is described in an older, not previously published patent application (German P 41 36 655.7; addition to P 40 42 289.5), in which a cathode which is separated electrically from the vacuum chamber, is configured as a magnetron cathode and comprises two parts electrically separated from one another, in which the target base body with yoke and magnet is coupled as the one part, with the interposition of a capacitor, to the negative pole of a DC power supply, and the target as the other part is connected to the power supply by a conductor, with the interposition of a choke and a resistor parallel to the latter. The target is coupled by an additional capacitor to the positive pole of the power supply and to the anode, which in turn is grounded, with the interposition of a resistor. An inductor is inserted into the branch line to the resistor and to the choke in series with the low-inductance capacitor, and the value of the resistor is typically between 2 thousand and 10 thousand ohms.

This older apparatus is already so constructed that it suppresses most of the arcs occurring during a coating process and reduces the energy of the arcs and improves the reignition of the plasma after an arc.

SUMMARY OF THE INVENTION

The present invention is addressed to the problem of bringing to the vanishing point the arcs occurring during the coating process performed by means of a magnetron sputtering source in a reactive atmosphere to disappear as completely as possible or, in a phase of the process in which the tendency to form an arc increases, detecting this tendency and counteracting it. This stabilization of the sputtering process is furthermore to be especially insensitive to residual water vapor in the tank.

In particular, the performance of the apparatus with regard to the tendency to form arcs is to be improved for those processes which are suitable for depositing nonconductive coatings in order to coat glass panes from metallically conductive targets in a reactive (e.g., oxidizing) atmosphere.

The problem of the tendency of the apparatus to form arcs mentioned above is solved in accordance with the invention by a method in which the medium-frequency voltage is so low that the plasma discharge is extinguished at each null of the alternating voltage and is reignited in each half-wave of the alternating voltage when the voltage of the transformer has risen sufficiently, for which purpose the two output terminals of the secondary winding of the transformer, coupled, with the interposition of a choke coil, to a medium-frequency generator, are coupled each to a cathode through supply lines which are coupled by a branch line into which a resonant circuit, preferably an inductor coil and a capacitor, is inserted, each of the two supply lines being coupled to the coating chamber both through a first network setting the direct-current potential with respect to ground and to the particular anode through a corresponding second network.

In accordance with the invention an apparatus is provided in which the output terminals of the secondary winding of a transformer coupled to a medium-frequency generator with the interposition of an inductor choke coil are connected each by supply lines to one of the cathodes, the supply lines being connected to a branch line into which a resonant circuit is inserted, preferably an inductor coil and a capacitor, and each of the two supply lines being connected to the coating chamber both through a first network setting the direct-current potential with respect to ground, and to a particular anode by a corresponding second network.

According to the invention, therefore, it is important to ignite the cathodes "softly," which can be done by means of an inductor choke coil which is inserted between the transformer and the medium frequency generator. Furthermore, a reversing system is provided between the cathodes which can be excited to oscillation by an arc and which extinguishes the arc when it reverses. The natural resonance of the resonant circuit preferably is a multiple of the working frequency of the system.

Also, it shall be possible to operate all cathodes with a freely selectable power ratio, so that their power potential is asymmetrical.

Pursuant to the invention, this objective is accomplished by a method and apparatus, for which the medium frequency voltage is dimensioned so low, that the plasma discharge is quenched during each passage of the A.C. voltage through zero and is re-ignited in each half wave of the A.C. voltage, when the voltage of the transformer has risen sufficiently. For this purpose, the two outputs of the secondary winding of the transformer, which is connected with interpositioning of an inductive choke coil with a medium frequency generator, are coupled to one another over a first branch line, in which a resonant circuit, preferably an inductor coil, and a capacitor are connected. Each of the two supply lines in each case are coupled by a first network, which sets the D.C. potential relative to ground, to the coating chamber, as well as by a corresponding second network to the respective anode. The terminal or linkage between the coil and the supply is coupled to the cathode of a rectifying diode, while the anode of the rectifying diode—with interpositioning of a resistor at the linkage—is coupled between the capacitor and the supply line. For this reason the two cathodes can be operated with a freely selectable power ratio.

Pursuant to the invention, an apparatus is provided, for which the output terminals of the secondary winding of a transformer, which is coupled with interpositioning of a choke coil with a medium frequency generator, are connected in each case over supply lines to one of the cathodes. The supply lines are connected over a first branch line, in which a resonant circuit, preferably an inductor coil and a capacitor, are connected. Each of the two supply lines is coupled in each case by a first network, which sets the D.C. potential relative to ground with the coating chamber, as well as by a corresponding second network with the respective anode. The terminals or linkages between coil and supply line and capacitor and supply line are connected over a second branch line, in which a rectifier diode and a resistor are connected. The cathode of the rectifier diode is coupled with the terminal between the supply line and the coil that is connected in parallel.

Pursuant to the invention, it matters that the cathodes be ignited "soft", which can happen with the help of an inductor, which is coupled between the transformer and the medium frequency generator. Moreover, a reversing arrangement is provided between the cathodes, which can be stimulated to oscillate by an arc and which quench the arc upon reversing. The natural resonance of the resonant circuit preferably is a multiple of the working frequency of the arrangement.

BRIEF DESCRIPTION OF THE DRAWINGS

The invention admits of a great variety of embodiments; a plurality of them are shown diagrammatically in the appended drawings wherein.

DESCRIPTION OF THE PREFERRED EMBODIMENTS

Figure 1:
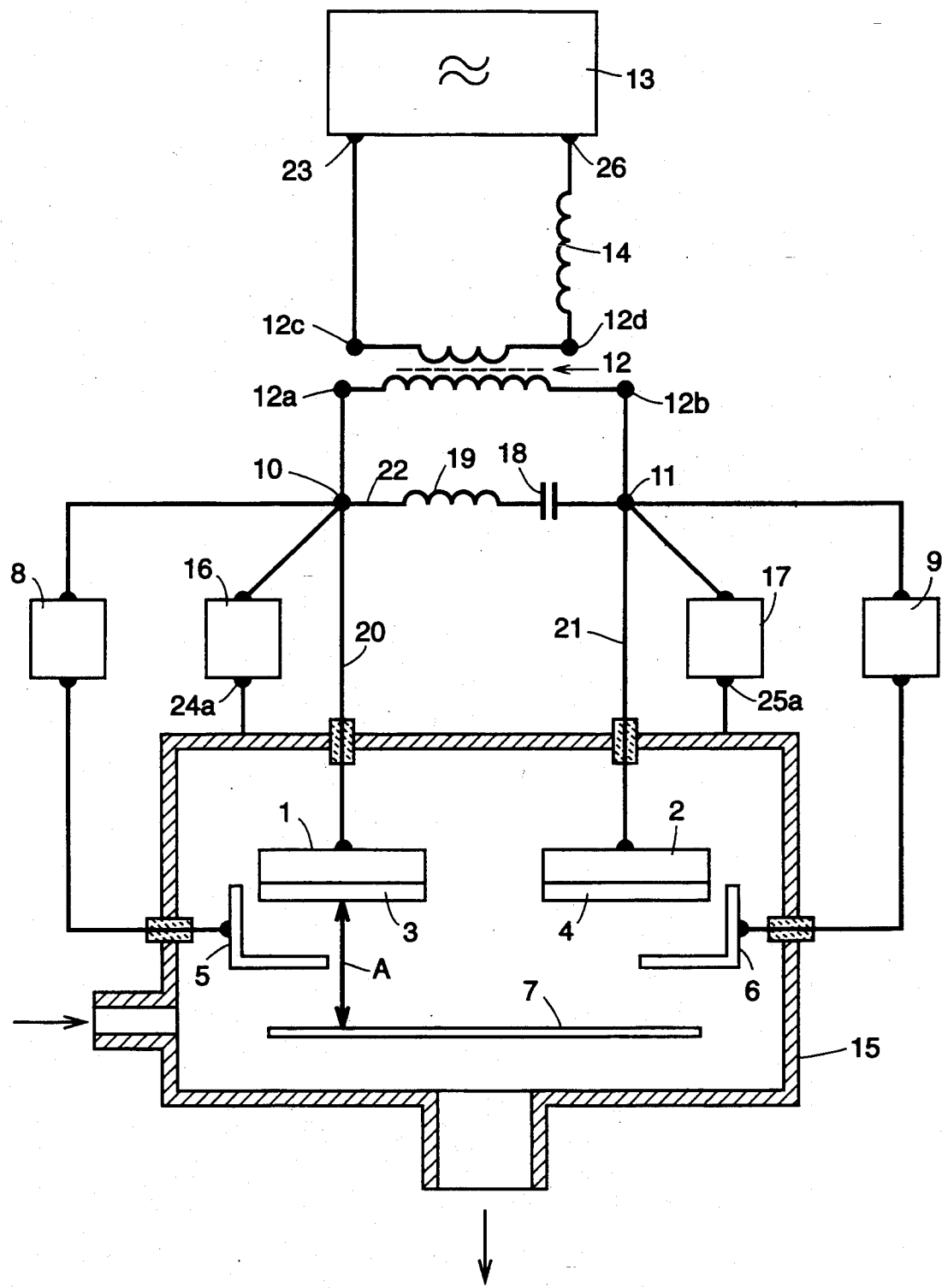
FIG. 1 is a circuit diagram showing the schematic circuit of an apparatus in accordance with the invention.

Referring now to FIG. 1, in the coating chamber 15 two magnetron cathodes 1 and 2 are disposed next to each other so that a plasma can be ignited between the two cathodes. The cathodes are oriented such that the surfaces of the targets 3 and 4 disposed on the cathodes lie in one plane and parallel to the plane of the substrate 7 or are disposed at an angle to one another and to the substrate plane.

Between the targets 3 and 4 and the substrate plane a distance A is preserved. In this space the anodes 5 and 6 are disposed, which are coupled by the electrical networks 8 and 9 to the cathodes 1 and 2 at terminal points 10 and 11, respectively.

At the junctions 10 and 11 of the supply lines 20 and 21, the cathodes 1 and 2 are furthermore connected each to one terminal 12a and 12b, respectively, of the secondary winding of the transformer 12. This transformer 12 receives its power from the medium frequency generator 13 in which one output terminal 26 of this medium frequency generator 13 is connected to a terminal of the inductor choke coil 14. The other output terminal 23 of the medium frequency generator 13 is connected to a terminal 12c of the primary winding of the transformer 12, and the other terminal 12d of the primary winding of transformer 12 is connected to a second terminal of the choke coil 14.

Junctions 10 and 11 are furthermore also connected to the networks 16 and 17, respectively. The second terminals 24 and 25 of the networks 16 and 17 are connected to the coating chamber 15. To the junction 10 there is connected one terminal of a coil 19 whose second terminal is connected to one terminal of the capacitor 18. The second terminal of the capacitor is connected to junction 11 through the branch line 22.

The networks 8-9 and 16-17 comprise diodes, resistors and condensers connected in series as will be more fully explained subsequently, and together they establish the direct-current potential with respect to ground.

In the system described above, the medium-frequency generator 13 produces a sinusoidal alternating current which is stepped up by the transformer 12 so that the voltage range is matched to the working voltage of the magnetron cathode 1, 2. The described circuit, cathode 1, transformer 12 to cathode 2, implies that between the two cathodes there is a galvanic connection in which the alternating current is induced by the transformer 12. In this way it is brought about that, at one moment in time, the cathode 1 forms the negative pole, i.e., the sputtering part of the discharge, and cathode 2 forms the positive pole of the discharge. At another moment in time the cathode 1 forms the positive pole of the discharge and cathode 2 is the negative pole and thus sputters.

The frequency of the medium-frequency voltage is made to be so low that upon each null point of the alternating voltage the plasma discharge is extinguished. It fires again in each half-wave of the alternating voltage as soon as the voltage at transformer 12 has sufficiently increased.

This alternation provides so that the discharge always finds a surface cleaned by the sputtering as the positive pole. When the one cathode serves as the positive pole it is coated with nonconductive coating by the other cathode sputtering at this moment. The alternating frequency preferably is selected so high that the time of occupation remains unimportant to the process.

Since the physical mechanism is identical to direct-current sputtering, arcs naturally occur. But arcing is associated not only with conditions at the target surface but also with time, current and potential conditions (if the alternating frequency is so high that the polarity changes before the arc can form). The choke 14 produces a delay in the current rise both in the ignition and in the formation of the arcs. The resonant circuit formed by the coil 19 and the capacitor 18 is adjusted to a frequency that is substantially higher than the working frequency, for example, approximately 50 times higher, for example, 0.5 MHz. If an arc should form this resonant circuit starts to oscillate and causes an additional change in the polarity of the cathodes so that the arc immediately vanishes. The networks 8-9 and 16-17 are such that the potentials of the electrodes 5-6 and of the coating chamber 15 are maintained such that low field strengths occur in the chamber 15 and thus likewise delay arc formation. Virtual freedom from arcing is achieved by the combination of these measures: 2 galvanically connected cathodes, frequency, choke, networks for potential adjustment.

For the working frequency an optimum has been found at 40 kHz. The use of frequencies other than 40 kHz, in the range from 8 kHz to 70 kHz is possible with some loss of quality.

Instead of single-phase alternating current a system using multiphase alternating current (3-phase AC) can be used.

The transformer 12 can be provided with several secondary windings, so that several pairs of cathodes can be operated.

The arrangement of the cathodes can be, instead of side by side,
nested one inside the other,
roof-like over the substrate,
opposite one another with a pierced substrate in the center.
spatially distributed like a quadrupole.

In addition to the planar magnetron the form of the cathodes used can also be
an interpole target
a tubular magnetron
a toroidal magnetron.

In practice it has been found that the process described above and the corresponding apparatus do not operate satisfactorily in all sizes of coating apparatus, and therefore the present further development of the invention is addressed to the task of improving the apparatus and the process so that the special circumstances of particularly large apparatus will no longer have any negative effect on the stability of the process and the reliability and efficiency of the apparatus.

This task is accomplished in accordance with the invention by a method in which the medium frequency voltage is selected so as to be so low that the plasma discharge is extinguished in each null point of the alternating voltage and reignites in each half-wave of the alternating voltage as soon as the voltage of the transformer has risen sufficiently, and for this purpose the one output of the secondary winding of the transformer connected to a medium frequency generator is connected by one supply line to one of the two cathodes and the other output of the secondary winding is connected by a second supply line to the other cathode, the two supply lines being connected to a branch line into which a resonating circuit is inserted, and each of the two supply lines is connected both through a first electrical circuit establishing the DC potential to ground to the coating chamber and through a corresponding second electrical circuit to the particular anode and through a branch line—with the interposition of a capacitor—to the coating chamber, and an inductor choke is inserted into the first connecting line of the connection of the secondary winding to the cathode between the resonant circuit and the winding terminal to damp current surges.

According to the invention an apparatus is provided in which the two output terminals of the secondary winding of a transformer connected to a medium frequency generator are connected each to a cathode through supply lines, the first and the second supply lines being connected to a branch line into which a resonant circuit—preferably an inductor coil and a capacitor—is inserted, and each of the two supply lines being connected to the coating chamber both by a first electrical circuit establishing the DC potential to ground and by a corresponding second electrical circuit to the particular anode and being connected each through a branch line with inserted capacitor to the coating chamber, and an inductor choke coil being inserted into the section of the first supply line connecting the resonant circuit to the secondary terminal.

According to the invention, therefore, it is important to ignite the cathodes "softly," which can be done by means of an inductor choke coil connected to the output of the transformer. Furthermore, a reversing system is provided between the cathodes which can be excited to oscillation by an arc and which extinguishes the arc when it reverses. The natural resonance of the resonant circuit preferably is a multiple of the working frequency of the system.

Figure 2:
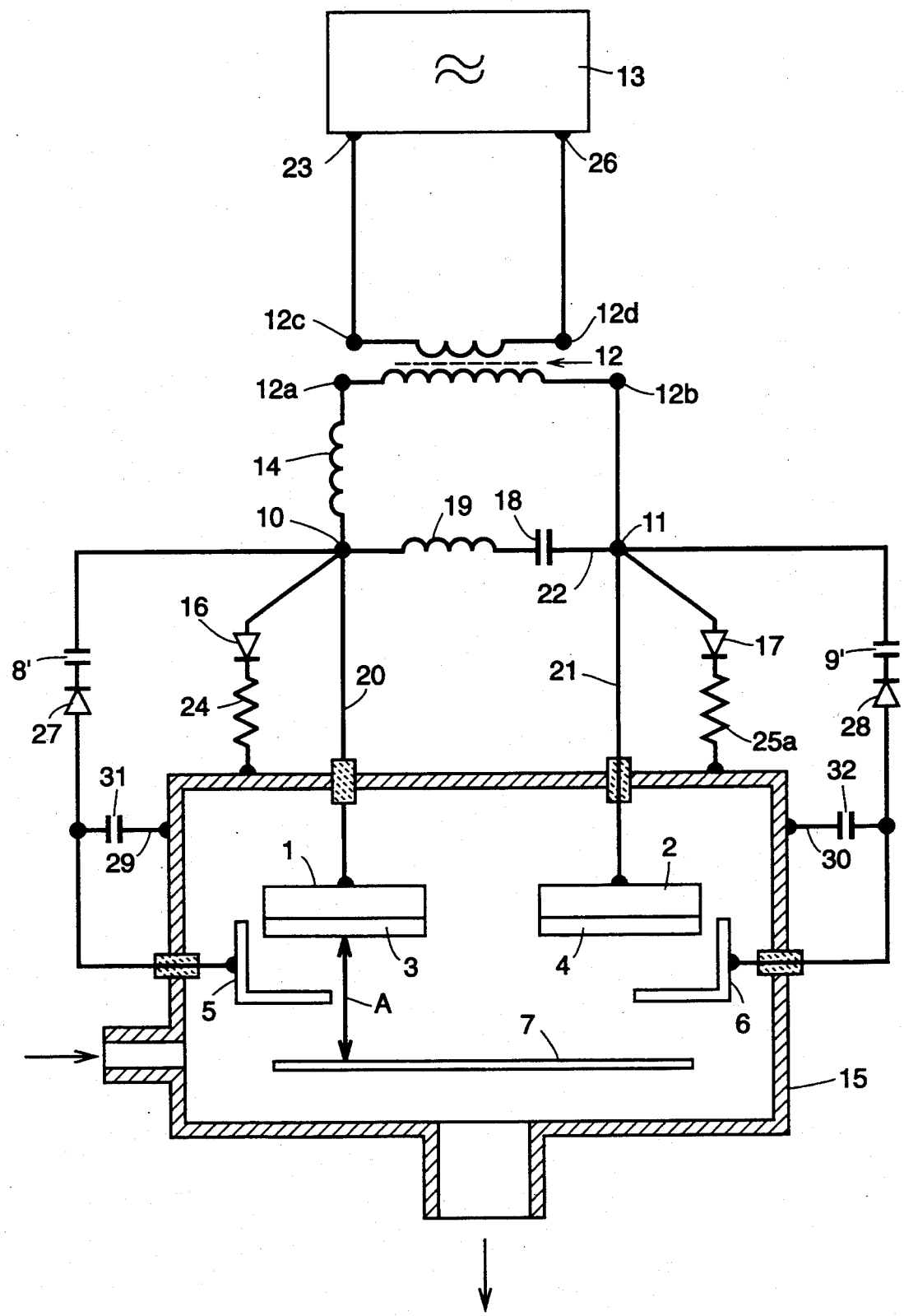
FIG. 2 is a circuit diagram showing the schematic circuit of an apparatus in accordance with the invention.

Referring to FIG. 2, in the coating chamber 15, two cathodes 1 and 2 are supplied by the medium-frequency generator 13 with sinusoidal alternating current of a frequency of, for example, 40 kHz such that the cathodes alternately constitute the minus pole and the plus pole of the sputter discharge.

In the coating chamber 15 two magnetron cathodes 1 and 2 are disposed so close together that a plasma can be ignited between the two cathodes. The cathodes are oriented such that the surfaces of the targets 3 and 4 disposed on the cathodes lie in one plane parallel to the plane of the substrate 7 or are arranged at an angle to one another and to the substrate plane.

Between the targets 3, 4, and the substrate plane a distance A is maintained. In this space are the electrodes 5, 6, which are connected each by an electrical circuit consisting of a capacitor 8' and 9', and a diode 27 and 28, respectively, with the cathodes 1 and 2, respectively, at the points 10 and 11, respectively.

At the junctions 10 and 11 of the supply lines 20 and 21, the cathodes 1 and 2 are furthermore connected each with a terminal 12a, 12b, of the secondary winding of the transformer 12, an inductor choke coil 14 being inserted into the connecting line from point 10 to terminal 12a. This transformer 12 obtains its power from the medium-frequency generator 13 in which one output terminal 23 of this medium-frequency generator 13 is connected to a terminal 12c of the primary winding of the transformer 12, and the other terminal 12d of the primary winding of transformer 12 is connected to the second terminal 26 of the generator 13.

The junctions 10 and 11 are furthermore also connected to the diodes 16 and 17, respectively, which are followed each by a resistor 24 and 25, respectively. The resistors 24 and 25 are connected each to the coating chamber 15. To the junction 10 is connected the one terminal of an inductor coil 19 whose second terminal is connected to the terminal of a capacitor 18. The second terminal of the capacitor is connected to junction 11 via the branch line 22.

The electrical circuits formed each by a resistor 24 and 25, respectively, and a diode 16 and 18, respectively, together establish the direct-current potential with respect to the ground. It is to be noted also that the electrical circuits 8, 27, and 9, 28, respectively, are coupled to the chamber 15 via branch lines 29, 30, into which condensers 31, 32, respectively, are inserted.

In the above-described system the medium-frequency generator 13 produces a sinusoidal alternating voltage which is raised by the transformer 12 to such a level that the voltage range is adapted to the working voltage of the magnetron cathodes 1 and 2. The described circuit from cathode 1, transformer 12 to cathode 2 implies that between the two cathodes a galvanic association exists into which the alternating voltage is induced through the transformer 12. This brings it about that at one moment in time the cathode 1 constitutes the negative pole, i.e., the sputtering part of the discharge, and cathode 2 the positive pole of the discharge. At another moment the cathode 1 forms the positive pole of the discharge and cathode 2 is the negative pole and thus sputters.

The frequency of the medium-frequency voltage is made so low that the plasma discharge is extinguished in each null point of the alternating voltage. It ignites again in each half-wave of the alternating voltage as soon as the voltage at the transformer 12 has risen sufficiently.

This alternation provides such that the discharge always finds as its positive pole a surface cleaned by the sputtering. When the one cathode serves as the positive pole it is covered with nonconductive coatings by the other cathode that in this moment is sputtering. Now, the alternating frequency preferably is chosen high enough so that the coating remains unimportant to the process.

Since the physical mechanism is identical to direct-current sputtering, arcs, of course, also occur. But the formation of an arc is tied in not only with conditions at the target surface, but also with time, and current and voltage conditions (if the alternating frequency is selected so high that the polarity changes again before the arc was able to form). The inductor choke coil 14 produces a delay in the rise of the current both in the ignition of the plasma and in the formation of the arc. The resonant circuit formed by the coil 19 and the condenser 18 is set for a frequency that is substantially higher than the working frequency, for example, about 50 times higher. If an arc should form, this resonant circuit oscillates and causes an additional change in the polarity of the cathodes, so that the arc immediately vanishes. The electrical circuits 8, 27 and 9, 28 see to it that the potentials of the electrodes 5 and 6 and of the coating chamber 15 are held so that slight field strengths occur in the chamber 15 and thus also delay the formation of arcs. The virtual freedom from arcing is achieved by the combination of the following measures: two galvanically connected cathodes 1, 2, resonant circuit 18, 19, choke 14, electrical circuits 8, 27, and 9, 28; plus 16, 24, and 17, 25 for the establishment of the potential.

For the working frequency an optimum has been found at 40 kHz. The use of frequencies varying from 40 kHz within the range of 8 kHz to 70 kHz is possible if losses of quality are acceptable.

Instead of single-phase alternating current a system of polyphase alternating current (3-phase AC) can be used.

Transformer 12 can be provided with several secondary windings so that several pairs of cathodes can be operated.

Instead of side-by-side, the arrangement of the cathodes can be:
 nested one within the other,
 forming a roof over the substrate
 opposite one another with a pierced substrate in the middle,
 arranged in space like a quadrupole.

In addition to the planar magnetron, the design of the cathodes can be:
 a target between poles
 a tubular magnetron
 a toroidal magnetron.

Figure 3:
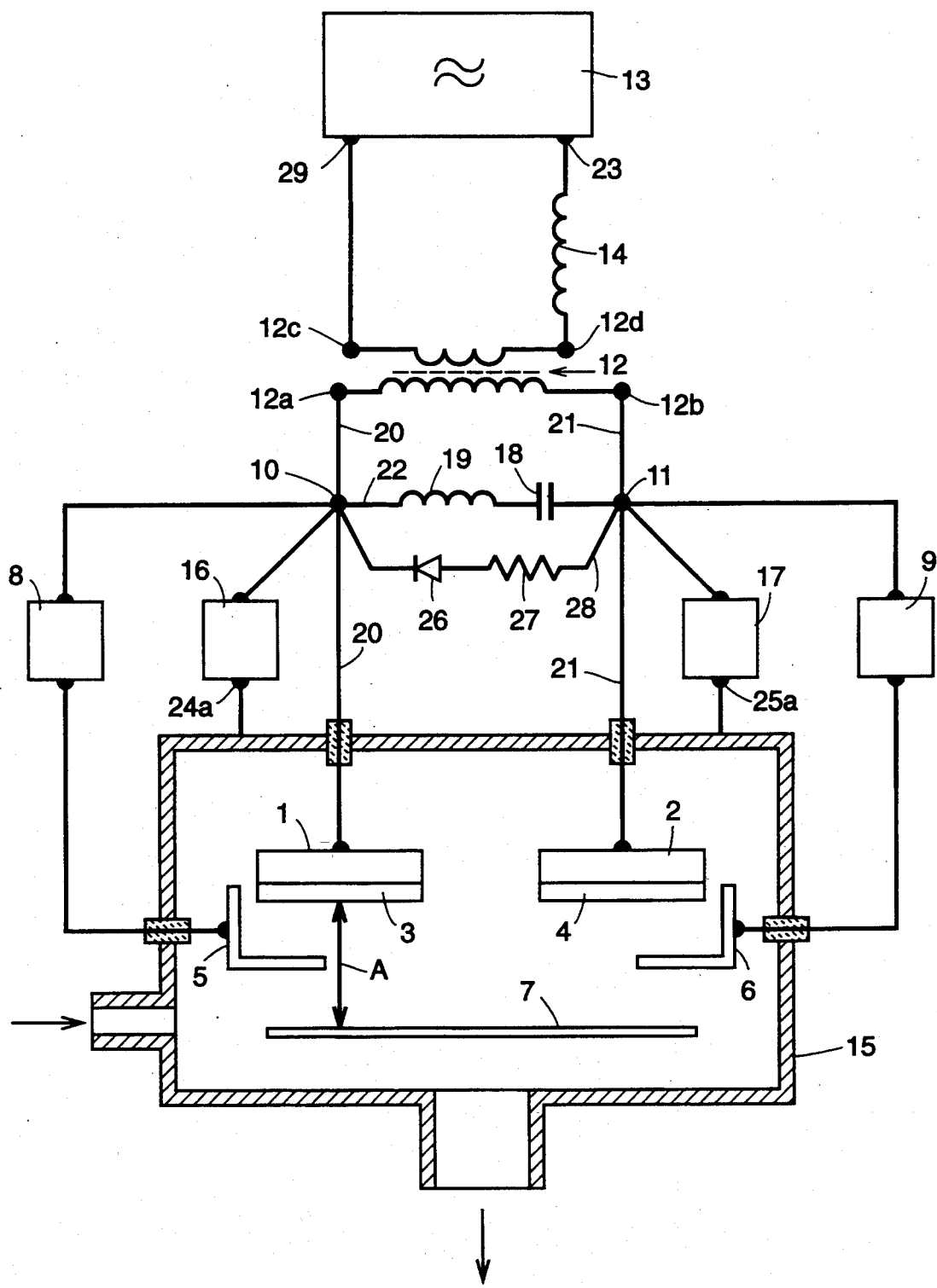
FIG. 3 is a schematic view of the apparatus and power supply.

Referring to the FIG. 3, in the coating chamber 15, two cathodes 1, 2 are supplied by the medium frequency generator 13 over the supply lines 20, 21 with sinusoidal A.C. current with a frequency of, for example, 40 kHz so that the cathodes alternately represent the negative pole and the positive pole of the sputtering discharge.

In the coating chamber 15, two magnetron cathodes 1, 2 are disposed adjacent to one another, so that a plasma can be ignited between the two cathodes. The cathodes are oriented so that the surfaces of the targets 3, 4, which are disposed on the cathodes, lie in one plane and parallel to the plane of the substrate 7 or are disposed at an angle to one another and to the substrate plane.

A distance A is maintained between the targets 3, 4 and the substrate plane. In this space, the electrodes 5 and 6 are disposed, which are connected through the electrical networks 8 and 9 with the cathodes 1 and 2 respectively at points 10 and 11 respectively.

In the terminal connection points 10 and 11 respectively, the cathodes 1 and 2 are furthermore connected with a terminal 12a or 12b of the secondary winding of the transformer 12 by respective supply lines 20, 21. This transformer 12 obtains its energy from the medium frequency generator 13, in that one output terminal 23 of this medium frequency generator 13 is connected with a terminal of the choke coil 14, the other output terminal 29 of the medium frequency generator 13 is connected with a terminal 12c of the primary coil of the transformer 12 and the other terminal 12d of the primary winding of the transformer 12 is connected with the second terminal of the choke coil 14.

The terminal points 10 and 11 are also connected with the networks 16 and 17 respectively, which in turn are connected with the coating chamber 15. The terminal points 10 and 11 are directly connected by a line 22 having an inductor 19 and a capacitor 18 in series, the capacitor being closer to point 11.

The networks 8, 9 and 16, 17 comprise series circuits of diodes, resistances and capacitors, to be described subsequently and, as a whole, set the D.C. potential relative to ground.

In the arrangement described above, the medium frequency generator 13 generates a sinusoidal A.C. voltage, which is raised with the transformer 12, so that the voltage range is made to fit the operating voltage of the magnetron cathode 1, 2. The circuit described of cathode 1, transformer 12 to cathode 2 means that, between the two cathodes, there is an electrical coupling in which the A.C. voltage is induced by the transformer 12. By means of this measure, it is achieved that at one point in time, the cathode 1 forms the negative pole, that is, sputtering part of the discharge, and the cathode 2 forms the positive pole of the discharge. At a different point in time, the cathode 1 forms the positive pole of the discharge and the cathode 2 the negative pole and, with that, sputters.

The frequency of the medium frequency voltage is selected to be so low, that the plasma discharge is quenched during each passage of the A.C. voltage through zero. It ignites again in each half wave of the A.C. voltage, as soon as the voltage has risen sufficiently at the transformer 12.

This interplay sees to it that the discharge always finds, as positive pole, a surface that is bare due to the material that has been sputtered from it. When the one cathode functions as the positive pole, it is coated with nonconducting layers from the other cathode, which is sputtering at this instant. A sufficiently high changing frequency preferably is selected, so that the coverage remains insignificant for the process.

Parallel to the connection line 22 between the terminal points 10 and 11, a second connection line 28 is provided, in which a rectifier diode 26 and a resistor 27 are connected, and, moreover, in such a manner, that the cathode of the rectifier diode 26 is connected with the first supply line 20 and the anode of the rectifier diode 26 is connected with the resistor 27, which, in turn, is connected to the second supply line 21.

When terminal point 10 is more negative than terminal point 11, a portion of the power is diverted through the diode 26 into the resistor 27. This power is withdrawn from the sputtering cathode 1. After the reversal of polarity of the A.C. voltage, the diode 26 blocks and the sputtering cathode 2 sputters with full power.

Since the physical mechanism is identical with D.C. voltage sputtering, arcs do, of course, also occur. Aside from the conditions at the target surface, the development of an arc is also linked to time and current and potential conditions (if such a high alternating frequency is selected, that the polarity changes again before the arc could develop). The inductor 14 brings about a delay in the increase in current during ignition as well as during the formation of the arcs. The resonant circuit, formed from the inductor 19 and the capacitor 18, is adjusted to a frequency which is significantly higher than the operating frequency, preferably about 50 times higher. Should an arc develop, this resonant circuit commences to oscillate and causes an additional change in the polarity of the cathodes, so that the arc disappears immediately. The networks 8, 9 and 16, 17 see to it that the potentials of the electrodes 5, 6 and of the coating chamber 15 are held so that low field strengths occur in the chamber 15 and, with that, said networks also retard the formation of arcs. The practical absence of arcs is then achieved by the combination of the following measures: two cathodes 1, 2 electrically connected by a resonant circuit 18, 19; an inductive coil 14; circuits 8, 9 establishing potentials between respective cathodes 1, 2 and respective anodes 5, 6; and circuits 16, 17 for establishing the potential between respective cathodes 1, 2 and the coating chamber 15.

The operating frequency was found to be optimum at 40 kHz. The use of frequencies deviating from 40 kHz in the range from 8 kHz to 70 kHz is conceivable if loss of quality is accepted.

Instead of a single phase, A.C. current, an arrangement with a multiphase (three-phase) alternating current can be used.

The transformer 12 can be provided with several secondary windings, so that several pairs of cathodes can be operated.

Instead of being next to one another, the arrangement of cathodes
- can be nested one inside the other
- can be arranged roof-shaped over the substrate
- can be arranged opposite one another with the perforated substrate in the middle,
- can be distributed spatially similarly to a quadrupole.

When the target materials are the same on the two cathodes 1, 2, it is possible to produce different distributions of the coating rate in the substrate plane.

If the target material, applied on cathode 1, is different from that applied on cathode 2, different mixing ratios can be set in the substrate plane. The composition of the layer can be changed as a function of its thickness (gradient layers) and the composition of the layers can be varied as a function of the longitudinal extent of the substrate.

Aside from the planar magnetron, the form of construction of the cathodes used can also be
- an interpolar target a tubular magnetron
a toroidal magnetron.

In practice it has been found that the process described above and the corresponding apparatus do not operate satisfactorily in all sizes of coating apparatus, and therefore a further development of the invention is addressed to the task of improving the apparatus and the process so that the special circumstances of particularly large apparatus will no longer have any negative effect on the stability of the process and the reliability and efficiency of the apparatus.

Figure 4:
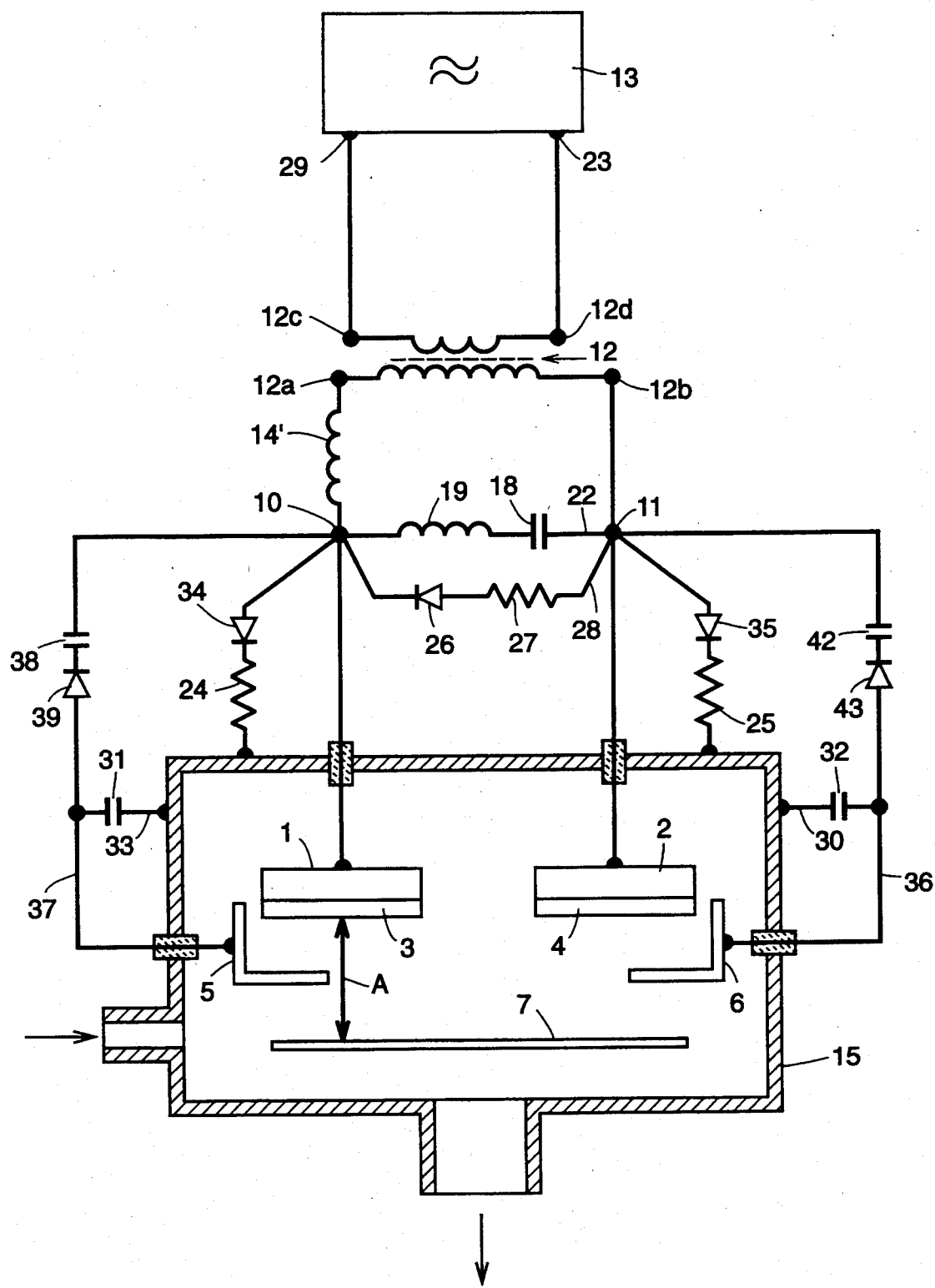
FIG. 4 is a schematic view showing a preferred embodiment of the power supply.

FIG. 4 depicts a variation of the embodiment of FIG. 1 and shows the circuits 8, 9, 16, 17 which establish a D.C. potential in greater detail. Only the features which differ from those in FIG. 1 will be described.

An inductor 14' is present between terminal 12a of the secondary winding of the transformer and terminal 10, replacing the inductor 14 between the AC generator 13 and the terminal 12d of the primary winding.

The potential between cathode 1 and anode 5 is established by a capacitor 38 and a diode 39 in line 37, which connects point 10 to anode 5. The rectifying diode 39 blocks any polarity reversal of anode 5, and a capacitor 31 in line 33 connecting line 37 to housing 15 prevents overvoltage. Likewise, the potential between cathode 2 and anode 6 is established by a capacitor 42 and diode 43 in line 36, which connects point 11 to anode 6. The rectifying diode 43 blocks any polarity reversal of the anode 5, and a capacitor 32 in line 30 prevents overvoltage.

The potential between the cathode 1 and the housing 15 is established by a resistor 24 and a diode 34, while the potential between the cathode 2 and the housing 15 is established by a resistor 25 and a diode 35. The diodes 34, 35 prevent the housing 15 from becoming negatively charged relative to the cathodes.

While there have been described what are at present considered to be the preferred embodiments of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. Apparatus for coating a substrate with nonconductive coatings, from electrically conductive targets in a reactive atmosphere, comprising: an evacuable coating chamber, a power source, cathodes enclosing magnets and disposed in the evacuable coating chamber and coupled to the power source of a predetermined frequency voltage including a predetermined frequency generator, targets which cooperate electrically with the power source and which are sputtered and whose sputtered particles deposit themselves on a substrate, anodes electrically separated from one another and from the sputtering chamber being disposed in a plane between the cathodes and the substrate, a secondary winding of a transformer having output terminals, the predetermined frequency voltage being selected so that plasma discharge is extinguished upon each null of an alternating voltage and reignites in each half-wave of the alternating voltage when the voltage of the transformer has risen, for which purpose the output terminals of the secondary winding of the transformer are coupled, with the interposition of an inductor choke, to the predetermined frequency generator, supply lines each for coupling the secondary winding of the transformer to one of the cathodes, the supply lines being connected to a branch line into which a resonant circuit is inserted, and a first network for coupling each of the two supply lines both to the coating chamber setting a direct-current potential with respect to ground, and a second network for coupling each of the two supply lines to an anode.

2. Apparatus for coating a substrate, with nonconductive coatings from electrically conductive targets in a reactive atmosphere, comprising: an evacuated coating chamber, cathodes enclosing magnets and disposed in the evacuated coating chamber, a current and voltage source of a predetermined frequency current and voltage including a predetermined frequency generator, targets which cooperate electrically with the current source and which are sputtered and whose sputtered particles deposit themselves on a substrate, anodes separated electrically from one another and from the sputtering chamber being disposed in a plane between the cathodes and the substrate, a secondary winding of a transformer having output terminals, the predetermined frequency voltage being selected so that plasma discharge is extinguished upon each null of an alternating voltage and reignites in each half-wave of the alternating voltage when the voltage of the transformer has risen, for which purpose one output terminal of the secondary winding of the transformer is coupled to the predetermined frequency generator, a first supply line for coupling the secondary winding of the transformer to one of the cathodes, a second supply line for coupling the other output terminal of the secondary winding to another of the cathodes, the two supply lines being connected via a branch line including a resonant circuit, a first electrical circuit for coupling each of the two supply lines to the coating chamber, establishing a direct-current potential with respect to ground, and a second electrical circuit for coupling each of the two supply lines to an anode, and a branch line—with interposition of a condenser—for coupling the second electrical circuit to the chamber, and to damp current surges, a first connecting line from the terminal of the secondary winding to the cathode between the resonant circuit and the terminal, a choke being in the first connecting line.

3. Apparatus for coating a substrate according to claim 2, in which first electrical circuits are inserted into the two branch lines connecting the supply lines to the coating chamber each comprise a resistor and a diode, and the second electrical circuits inserted into the branch lines connecting the supply line to the diodes each comprise a condenser and a diode.

4. Apparatus for coating a substrate comprising:
a coating chamber that is evacuable, a current supply, cathodes which are disposed in the coating chamber and are coupled to the current supply, targets which work together electrically with cathodes and which are sputtered and provide sputtered particles which are deposited on a substrate, two anodes, separated electrically from one another and from the sputtering chamber, being in a plane between the cathodes and the substrate, a transformer, having a secondary winding having two output terminals, a generator, an inductor coupled between said generator and said transformer, each of said two output terminals of the secondary winding being coupled to a cathode, first and second supply lines for coupling said secondary winding to said cathodes and being coupled to one another by a first branch line, which includes a resonant circuit, a pair of first networks, a pair of second networks, each of the two supply lines being connected in each case by a first network, which adjusts a D.C. potential relative to ground, to the coating chamber, as well as by a corresponding second network to a respective anode, a rectifier diode having a cathode and anode, a resistor, a first terminal between the resonant circuit and the second supply line, a second terminal between the resonant circuit and first supply line being coupled to the cathode of the rectifier diode, while the anode of the rectifier diode is coupled to the first terminal, so that the two cathodes can be operated with a freely selectable power ratio.

5. Apparatus in accordance with claim 4 in which said resonant circuit comprises an inductor and a capacitor in series.

6. Apparatus for coating a substrate, comprising: an evacuable coating chamber, a current source, cathodes containing magnets and disposed in the coating chamber and coupled to the current source, said cathodes cooperating electrically with the targets which are sputtered and having sputtered particles which deposit themselves on a substrate, anodes separated electrically from one another and from the chamber and which are disposed in a plane between the cathodes and the substrate, a generator, a transformer having a secondary winding connected to the generator and having two output terminals coupled each to a cathode via first and second supply lines, the first and the second supply lines being coupled together via two parallel branch lines and into the first branch line a resonant circuit, comprising a first inductor and a condenser, being inserted, and the two supply lines being coupled in each case to the coating chamber both through a first pair of electrical circuits establishing a direct-current potential to ground and through a corresponding second pair of electrical circuits to the anodes, a second inductor inserted into the first supply line, a first terminal between the first inductor and a rectifier diode having an anode and a cathode, a second terminal between the condenser of the resonant circuit and the second supply line, the inductor being connected to the cathode of the rectifier diode, while the anode of this rectifier diode is coupled with interposition of a resistor to the second terminal, such that the two cathodes can be operated with a freely selectable power ratio.

7. Apparatus for coating a substrate according to claim 6, in which the first pair of electrical circuits inserted into the two branch lines coupling the supply lines to the coating chamber are formed each of a resistor and a diode second pair of electrical circuits being inserted into the branch lines coupling the supply lines to the anodes, each of which second electrical circuits includes a condenser and a diode.

8. Apparatus for coating a substrate according to claim 7, which includes first branch lines coupling the supply lines to the anodes and second branch lines each including a condenser which is connected to the coating chamber, the second branch line being connected in each case with a section of line which leads from the diode to the anode.

9. Apparatus for coating a substrate by magnetron sputtering, comprising an evacuable coating chamber,
a pair of magnetron cathodes in said coating chamber,
a pair of targets associated with respective said cathodes,
a pair of anodes in a plane between said cathodes and the substrate, said anodes being separated electrically from one another,
an A.C. generator having two output terminals,
a transformer having a primary winding and a secondary winding, said primary winding being connected to said output terminals of said A.C. generator, said secondary winding having two output terminals,
first and second supply lines connecting respective said output terminals of said secondary winding to respective said cathodes,
resonant circuit means connecting said first supply line to said second supply line; and
rectifying circuit means connecting said first supply line to said second supply line in parallel with said resonant circuit means.

10. Apparatus as in claim 9 further comprising an inductor between one of said output terminals of said A.C. generator and a respective said cathode.

11. Apparatus as in claim 10 wherein said inductor is between A.C. generator and said primary winding of said transformer.

12. Apparatus as in claim 10 wherein said inductor is between one of said output terminals of said secondary winding and a respective said cathode.

13. Apparatus as in claim 9 wherein said resonant circuit means comprises an inductor and a capacitor connected in series.

14. Apparatus as in claim 9 wherein said rectifying circuit means comprises a rectifier diode and a resistor connected in series.

15. Apparatus as in claim 9 further comprising potential adjusting means connecting each said supply line to said coating chamber.

16. Apparatus as in claim 15 wherein said potential adjusting means comprises a resistor and a diode connected in series between each said supply line and said coating chamber.

17. Apparatus as in claim 9 further comprising potential adjusting means connecting each said supply line to a respective said anode.

18. Apparatus as in claim 17 wherein said potential adjusting means comprises a capacitor and a diode connected in series between each said supply line and a respective anode.

19. Apparatus as in claim 18 further comprising a capacitor connecting each said anode to said chamber.

20. Apparatus as in claim 9 further comprising
potential adjusting means connecting each said supply line to said coating chamber, and
potential adjusting means connecting each said supply line to a respective said anode.

21. Apparatus as in claim 20 wherein said potential adjusting means connecting each said supply line to said chamber comprises a resistor and a diode connected in series.

22. Apparatus as in claim 21 further comprising a capacitor connecting each said anode to said chamber.

23. Apparatus as in claim 20 wherein said potential adjusting means connecting each said supply line to a respective said anode comprises a diode and a capacitor connected in series.

* * * * *

UNITED STATES PATENT AND TRADEMARK OFFICE
CERTIFICATE OF CORRECTION

PATENT NO : 5,415,757
DATED : May 16, 1995
INVENTOR(S): Szcyrbowski et al.

It is certified that error appears in the above-identified patent and that said Letters Patent is hereby corrected as shown below:

In Column 5, line 5 of the Patent, change "24 and 25" to -- 24a and 25a --.

Signed and Sealed this

Nineteenth Day of May, 1998

Attest:

BRUCE LEHMAN

*Attesting Officer*     *Commissioner of Patents and Trademarks*